(12) United States Patent
Moriwaki et al.

(10) Patent No.: US 10,504,888 B2
(45) Date of Patent: Dec. 10, 2019

(54) ACTIVE MATRIX SUBSTRATE AND X-RAY IMAGING PANEL INCLUDING SAME

(71) Applicant: SHARP KABUSHIKI KAISHA, Sakai, Osaka (JP)

(72) Inventors: Hiroyuki Moriwaki, Sakai (JP); Akinori Kubota, Sakai (JP); Fumiki Nakano, Sakai (JP); Wataru Nakamura, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/147,427

(22) Filed: Sep. 28, 2018

(65) Prior Publication Data

US 2019/0096876 A1 Mar. 28, 2019

(30) Foreign Application Priority Data

Sep. 28, 2017 (JP) .................. 2017-189117

(51) Int. Cl.
| | |
|---|---|
| *H01L 27/02* | (2006.01) |
| *G01T 1/20* | (2006.01) |
| *G01T 1/208* | (2006.01) |
| *H01L 27/146* | (2006.01) |

(52) U.S. Cl.
CPC .......... *H01L 27/0292* (2013.01); *G01T 1/208* (2013.01); *G01T 1/2018* (2013.01); *H01L 27/0255* (2013.01); *H01L 27/0296* (2013.01); *H01L 27/14663* (2013.01)

(58) Field of Classification Search
CPC .... H01L 27/0292; G01T 1/2018; G01T 1/208
See application file for complete search history.

(56) References Cited

U.S. PATENT DOCUMENTS

| | | | |
|---|---|---|---|
| 6,333,769 B1 | 12/2001 | Suzuki et al. | |
| 2005/0017187 A1* | 1/2005 | Petrick | A61B 6/585 |
| | | | 250/370.09 |
| 2009/0302202 A1* | 12/2009 | Sato | H01L 27/14603 |
| | | | 250/208.1 |

FOREIGN PATENT DOCUMENTS

| | | |
|---|---|---|
| JP | 2000-019556 A | 1/2000 |
| JP | 2009-290171 A | 12/2009 |

* cited by examiner

*Primary Examiner* — Hugh Maupin
(74) *Attorney, Agent, or Firm* — ScienBiziP, P.C.

(57) ABSTRACT

Provided is a technique of image pickup without being affected by leakage current on an active matrix substrate that includes photoelectric conversion elements.

An active matrix substrate 1 includes photoelectric conversion elements that are respectively provided with respect to a plurality of pixels defined by gate lines and data lines 10, and a bias line 13 supplying a bias voltage to each photoelectric conversion element. Further, the active matrix substrate 1 further includes a plurality of data protection circuit units 16a that are connected with the data lines 10, respectively, and a first common line 17a that is connected with the data protection circuits 16a and has a potential equal to or lower than those of the data lines 10, outside the image pickup area composed of a plurality of pixels. The data protection circuit unit 16a includes a first data non-linear element 161a, and the first data non-linear element 161a is connected in a reverse bias state between the first common line 17a and the data lines 10.

8 Claims, 5 Drawing Sheets

ACTIVE MATRIX SUBSTRATE AND X-RAY IMAGING PANEL INCLUDING SAME

TECHNICAL FIELD

The disclosure relates to an active matrix substrate and an X-ray imaging panel including the same.

BACKGROUND ART

A protection circuit for protecting thin film transistors provided on an active matrix substrate from static electricity has been conventionally proposed. For example, Patent Document 1 indicated below discloses a technique for protecting thin film transistors provided in pixels from static electricity, in a horizontal electric field type liquid crystal display device in which counter electrodes and pixel electrodes are formed on an active matrix substrate. In this liquid crystal display device, common lines are provided that intersect with scanning signal lines and video signal lines outside a display area, and are arranged so as to surround the display area. To portions where the scanning signal lines and the video signal lines intersect with the common lines, non-linear elements are connected. Further, counter voltage signal lines provided outside the display area and connected with the counter electrodes are connected with the common lines via high-resistance elements.

In this liquid crystal display device, even if static electricity enters from the scanning signal lines, the video signal lines, or the common lines, it is diffused via non-linear elements to the common lines, and the thin film transistors of the pixels therefore can be protected from static electricity. Further, since the common lines and the counter voltage signal lines are connected via the high-resistance elements, leakage current via the non-linear elements does not flow through the counter voltage signal lines. With this configuration, the counter voltage is hardly distorted, and the deterioration of the image quality can be decreased.

Further, Patent Document 2 indicated below discloses a configuration of a solid-state image pickup device in which electrostatic protection circuits are connected with the data lines. This electrostatic protection circuit includes a non-linear element connected in a reverse bias state between a data line and a bias line, and a non-linear element connected in a reverse bias state between a data line and a high-potential line to which a potential higher than that of the data line is applied. In this solid-state image pickup device, since the non-linear element connected to the data line, in the electrostatic protection circuit, is in the reverse bias state, leakage current from the data line can be reduced.

PRIOR ART DOCUMENT

Patent Document

Patent Document 1: JP-A-2000-19556
Patent Document 2: JP-A-2009-290171

SUMMARY OF THE INVENTION

Problem to be Solved by the Invention

Applying the above-described electrostatic protection circuits of Patent Document 1 to an active matrix substrate can protect thin film transistors from static electricity in a process of manufacture of an imaging panel that includes photoelectric conversion elements. In this case, since the video signal lines and the scanning signal lines are connected with the common lines via the non-linear elements, leakage current of the non-linear elements enters the video signal lines via the common lines in some cases.

In the liquid crystal display device of Patent Document 1 described above, since liquid crystal is driven with video signal voltages so that an image is written in pixels, the video signal voltage is not influenced by leakage current of the electrostatic protection circuits. However, an imaging panel is read out minute charges accumulated in a pixel as an electric current, and accordingly, if even a very small leakage current enters a video signal line, electric current read out of the video signal line changes, and appropriate image pickup cannot be performed.

Further, even if a non-linear element is connected in a reverse bias state to a data line as is the case with the configuration of Patent Document 2 described above, minute leakage current flows through a data line via a non-linear element. As a potential difference between an anode and a cathode of a non-linear element increases, leakage current increases as well, thereby making highly accurate image pickup difficult. Still further, when a bias line has a higher potential than that of a data line in the configuration of Patent Document 2 described above, forward-direction electric current flows through a non-linear element between the bias line and the data line. Accordingly, in a case where static electricity enters the bias line, static electricity cannot be released before the non-linear element becomes forward-biased, and elements such as a bias line and a photoelectric conversion element may be destroyed during this period.

It is an object of the following invention to provide a technique of image pickup without being influenced by leakage current on an active matrix substrate that includes photoelectric conversion elements.

Means to Solve the Problem

An active matrix substrate of the present invention to achieve the above-described object includes: an image pickup area that has a plurality of pixels that are defined by a plurality of gate lines and a plurality of data lines intersecting with the gate lines; photoelectric conversion elements that are provided with respect to the pixels, respectively; a bias line that supplies a bias voltage to the photoelectric conversion elements provided with respect to the pixels; a plurality of data protection circuits that are connected with the data lines, respectively, outside the image pickup area; and a first common line that is connected with the data protection circuits outside the image pickup area and has a potential equal to or lower than those of the data lines. Each of the data protection circuits includes a first data non-linear element, and the first data non-linear element is connected in a reverse bias state between the first common line and the data lines.

Effect of the Invention

The present invention makes it possible to perform image pickup without being influenced by leakage current on an active matrix substrate that includes photoelectric conversion elements.

MODE FOR CARRYING OUT THE INVENTION

Figure 1:
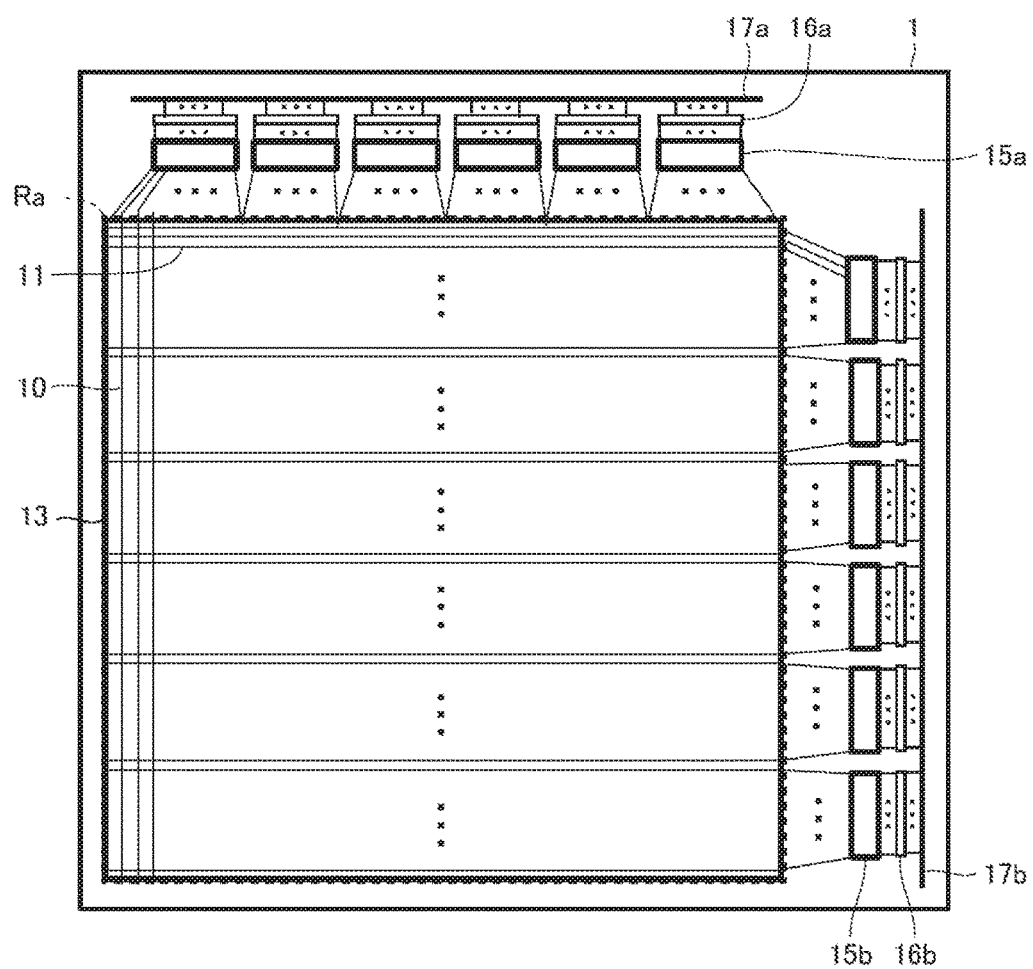
FIG. 1 illustrates a schematic configuration of an active matrix substrate of Embodiment 1.

An active matrix substrate according to one embodiment of the present invention includes: an image pickup area that has a plurality of pixels that are defined by a plurality of gate lines and a plurality of data lines intersecting with the gate lines; photoelectric conversion elements that are provided with respect to the pixels, respectively; a bias line that supplies a bias voltage to the photoelectric conversion elements provided with respect to the pixels; a plurality of data protection circuits that are connected with the data lines, respectively, outside the image pickup area; and a first common line that is connected with the data protection circuits outside the image pickup area and has a potential equal to or lower than those of the data lines. Each of the data protection circuits includes a first data non-linear element, and the first data non-linear element is connected in a reverse bias state between the first common line and the data lines (the first configuration).

According to the first configuration, the first data non-linear element as the data protection circuit is connected to each data line, and the first common line is connected to the first data non-linear element. The first common line has a potential equal to or lower than those of the data lines, and the first data non-linear element is connected in a reverse bias state between the data lines and the first common line. Even if leakage current of a certain first data non-linear element flows into the first common line, therefore, the leakage current does not flow into the data lines via other first data non-linear elements. Further, as the potential of the first common line is closer to the potentials of the data lines, leakage current of the first data non-linear element can be reduced further, whereby the data lines are less likely to be influenced by leakage current.

The first configuration may be further characterized in further including a bias protection circuit connected with the bias line and the first common line, wherein the bias line is composed of a first bias line provided outside the image pickup area, and second bias lines that are provided in the pixels and are connected with the first bias line; the bias protection circuit includes a first bias non-linear element; the first common line has a potential that is higher than that of the bias line, and is equal to or lower than those of the data lines; and each first bias non-linear element is connected in a reverse bias state between the first bias line and the data lines (the second configuration).

According to the second configuration, the first bias line as a part of the bias line and the data lines are connected via the first common line. With this configuration, static electricity is less likely to occur between the bias line and the data lines. In addition, the first common line has a potential which is intermediate between the potential of the bias line and the potentials of the data lines. As compared with a case where the first bias line and the data line are simply connected via the first bias non-linear element and the first data non-linear element, the difference between the potential of the bias line and the potential of the data line decreases, whereby leakage current of the first data non-linear element can be reduced. Further, even if static electricity having a voltage greater than that of the first common line enters from the bias line, the data line is not influenced by static electricity, since the first data non-linear element is reverse-biased.

The first configuration may be further characterized in further including: a second common line that is provided outside the image pickup area and has a potential higher than those of the data lines; and a bias terminal that is provided outside the image pickup area and has a potential lower than that of the bias line, wherein the bias line is composed of a first bias line provided outside the image pickup area, and second bias lines that are provided in the pixels and are connected with the first bias line; each of the data protection circuits includes a second data non-linear element in addition to the first data non-linear element; each second data non-linear element is connected in a reverse bias state between the data line and the second common line; the bias protection circuit includes a second bias non-linear element in addition to the first bias non-linear element; and the second bias non-linear element is connected in a reverse bias state between the bias terminal and the first bias line (the third configuration).

According to the third configuration, the second data non-linear element is connected in a reverse bias state between the data line and the second common line. The second common line has a potential higher than those of the data lines. Even if static electricity having a voltage higher than that of the second common line enters from a certain data line, therefore, static electricity flows via the second data non-linear element connected to the foregoing data line to the second common line, and does not follow into another data line. The second bias non-linear element is connected in a reverse bias state between the first bias line and the bias terminal. Even if static electricity having a voltage lower than that of the bias terminal enters the first bias line, therefore, electric current can be flown from the bias terminal to the bias line, whereby static electricity does not flow into the data line.

Any one of the first to third configurations may be further characterized in further including a plurality of gate protection circuits that are provided outside the image pickup area and are connected with the gate lines, respectively, wherein each of the gate protection circuits includes two gate non-linear elements; the gate protection circuits are connected in cascade; and each of the two gate non-linear elements is connected in a reverse bias state with the gate line (the fourth configuration).

With the fourth configuration, even if static electricity occurring to the gate line causes the non-linear element of the gate protection circuit to be forward-biased, static electricity is dispersed to the gate lines. The data lines are not affected by static electricity, and image pickup can be surely achieved.

Any one of the first to third configurations may be further characterized in further including: a plurality of gate protection circuits that are provided outside the image pickup area and are connected with the gate lines, respectively; and a fourth common line that is provided outside the image pickup area and has the same potential as that of the first common line, wherein each of the gate protection circuits includes two gate non-linear elements; and one of the two gate non-linear elements is connected in a reverse bias state between one of the gate lines and the fourth common line, and the other gate non-linear element is connected in a forward bias state between the one of the gate lines and the fourth common line (the fifth configuration).

With the fifth configuration, even if one of non-linear element is forward-biased due to static electricity occurring to the gate line, static electricity can be caused to flow to the fourth common line, and the data lines are less likely to be influenced by static electricity.

Any one of the first to third configurations may be further characterized in further including: a plurality of gate protection circuits that are provided outside the image pickup area and are connected with the gate lines, respectively; and a fourth common line that is provided in a floating state outside the image pickup area, wherein each of the gate protection circuits includes two gate non-linear elements; and one of the two gate non-linear elements is connected in a reverse bias state between one of the gate lines and the fourth common line, and the other gate non-linear element is connected in a forward bias state between the one of the gate lines and the fourth common line (the sixth configuration).

With the sixth configuration, even if one of the non-linear elements is forward-biased due to static electricity occurring to the gate line, static electricity can be caused to flow to the fourth common line, whereby being dispersed to each gate line via the non-linear elements. Consequently, each gate line is less likely to be influenced by static electricity. Further, even if the fourth common line is in a floating state and its potential becomes uncertain, a predetermined voltage applied to the gate lines from outside can be maintained.

An X-ray imaging panel according to one embodiment of the present invention includes the active matrix substrate of any one of the first to sixth configurations; and a scintillator that is provided on one of surface sides of the active matrix substrate and converts irradiated X-ray into fluorescence (the seventh configuration).

According to the seventh configuration, the first data non-linear element as the data protection circuit is connected to each data line, and the first common line is connected to the first data non-linear element. The first common line has a potential equal to or lower than those of the data lines, and the first data non-linear element is connected in a reverse bias state between the data lines and the first common line. Even if leakage current of a certain first data non-linear element flows into the first common line, therefore, the leakage current does not flow into the data lines via other first data non-linear elements. Further, as the potential of the first common line is closer to the potentials of the data lines, leakage current of the first data non-linear element can be reduced further. Consequently, charges corresponding to fluorescence produced by the scintillator, can be surely read out of the data lines, without being affected by leakage current.

The seventh configuration may be further characterized in further including a driving circuit that is connected with the active matrix substrate and scans the gate lines; and a readout circuit that is connected with the active matrix substrate and reads out charges corresponding to fluorescence as a result of conversion by the scintillator through the data lines (the eighth configuration).

With the eighth configuration, leakage current of the first data non-linear element is reduced, and charges corresponding to fluorescence produced by the scintillator can be surely read out of the data lines.

The following description describes embodiments of the present invention in detail, while referring to the drawings. Identical or equivalent parts in the drawings are denoted by the same reference numerals, and the descriptions of the same are not repeated.

[Embodiment 1]
(Configuration)

FIG. 1 is a plan view illustrating a schematic configuration of an active matrix substrate in the present embodiment. The active matrix substrate 1 can be used in, for example, an X-ray imaging panel. More specifically, by providing a scintillator for converting X-ray transmitted through an object into fluorescence (scintillation light) on one of surface sides of the active matrix substrate 1, an X-ray imaging panel can be manufactured. The active matrix substrate 1 in the present embodiment is an active matrix substrate before the scintillator are provided thereon, and influences of static electricity or leakage current that occurs in the process of the manufacture is reduced. The following description specifically describes the configuration of the active matrix substrate 1.

The active matrix substrate 1 includes a plurality of data lines 10, and a plurality of gate lines 11 that intersect with the data lines 10. The active matrix substrate 1 has an image pickup area Ra that is composed of areas (hereinafter referred to as pixels) each of which is surrounded by the data lines 10 and the gate lines 11.

Inside the image pickup area Ra, a bias line 13 is arranged so as to surround the image pickup area Ra. Though the illustration is omitted in this drawing, each pixel is further provided with a bias line (hereinafter referred to as a branch bias line) led out from the bias line 13.

In an area on one of the data line 10 end sides, outside the image pickup area Ra, there are arranged terminal parts 15a, protection circuit units 16a, and a common line 17a. Further, in an area on one of the gate line 11 end sides, outside the image pickup area Ra, terminal parts 15b, protection circuit units 16b, and a common line 17b are arranged. Details of these parts are described below.

Figure 2:
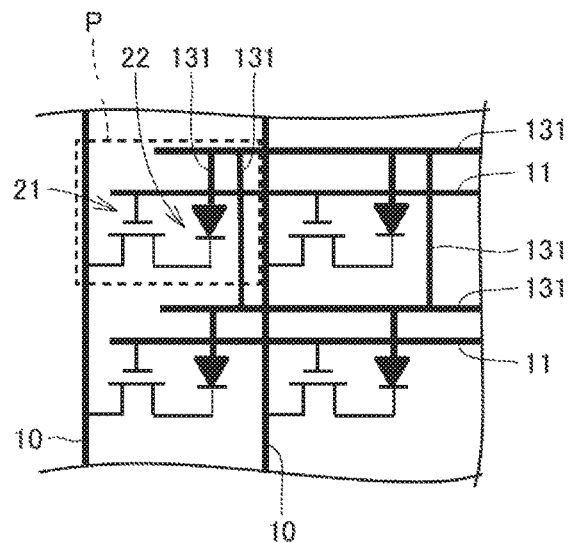
FIG. 2 is an equivalent circuit diagram of a pixel of the active matrix substrate illustrated in FIG. 1.

Here, the following description describes a configuration of the pixel in the image pickup area Ra. FIG. 2 is an equivalent circuit diagram illustrating a configuration of the pixel. As illustrated in FIG. 2, the pixel P includes a thin film transistor (TFT) 21 and a photoelectric conversion element 22.

The photoelectric conversion element 22 includes a PIN photodiode, and a pair of electrodes (a cathode electrode, and an anode electrode). The source of TFT 21 is connected with the data line 10, and the drain of TFT 21 is connected with the cathode electrode of the photoelectric conversion element 22. The anode electrode of the photoelectric conversion element 22 is connected with branch bias line 131.

In the present embodiment, in the pixel, the branch bias line 131 is formed in a slit form. The branch bias line 131 is connected with the anode electrode of the photoelectric conversion element 22 via an interlayer insulating film that is not illustrated. To secure a large light receiving area, the anode electrode of the photoelectric conversion element 22 is provided within the pixel so as to be in close contact with the data line 10, when viewed in a plan view. The branch bias line 131 and the anode electrode of the photoelectric conversion element 22 are provided in a layer different from that for the data line 10, and an interlayer insulating film (not shown) is provided between the anode electrode and the data line 10. A capacitor is formed between the data line 10 and an end of the anode electrode of the photoelectric conversion element 22 in the most closest contact with the data line 10, with the interlayer insulating film (not shown) being interposed therebetween. Consequently, the data line 10 and the end of the anode electrode of the photoelectric conversion element 22 are coupled with the capacitor being interposed.

Incidentally, though not being illustrated in FIG. 1 and the like, a driving circuit that applies a scanning voltage to scan the gate lines 11, and a read-out circuit that reads out charges converted by the PIN photodiodes from the data lines 10 are connected to the active matrix substrate 1. When TFT 21 connected with the gate line 11 scanned is turned ON, an electric signal corresponding to the charges converted by the photoelectric conversion element 22 is output through the data line 10 to the read-out circuit.

Next, the following description describes exemplary configurations of the terminal parts 15a, 15b, the protection circuit units 16a, 16b, and the common line 17a, 17b, and an exemplary connection thereof.

Figure 3:
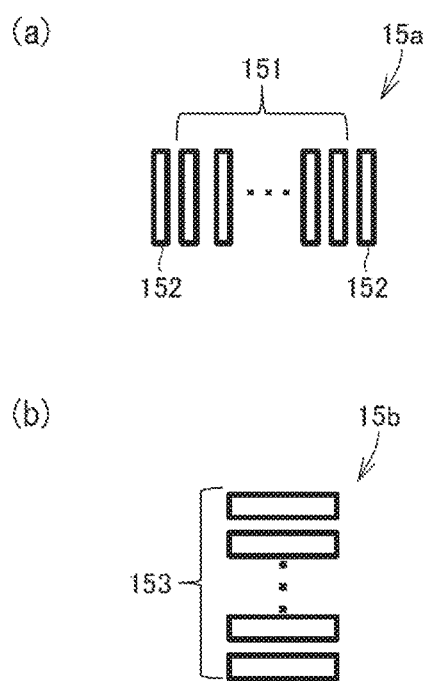
FIG. 3 is a schematic diagram for explaining a configuration of a terminal part illustrated in FIG. 1.

FIG. 3 is a schematic diagram illustrating the configurations of the terminal parts 15a, 15b. As illustrated in (a) of FIG. 3, the terminal part 15a includes a plurality of data terminals 151 that connected with the data lines 10, respectively, and bias terminals 152 that connected with the bias line 13. Additionally, as illustrated in (b) of FIG. 3, the terminal part 15b includes a plurality of gate terminals 153 that are connected with the gate lines 11, respectively.

Figure 4A:
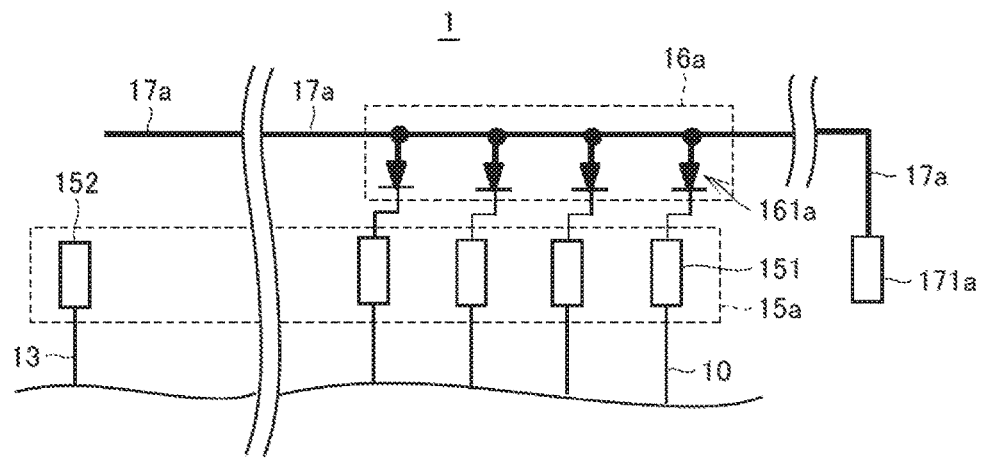
FIG. 4A illustrates an exemplary connection between a protection circuit unit 16a, a terminal part 15a, and a common line 17a illustrated in FIG. 1.
Figure 4B:
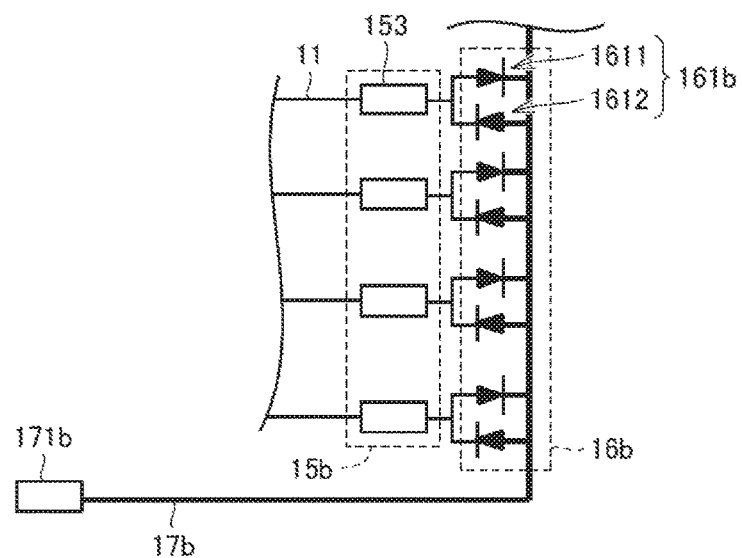
FIG. 4B illustrates an exemplary connection between a protection circuit unit 16b, a terminal part 15b, and a common line 17b illustrated in FIG. 1.

FIG. 4A illustrates an exemplary connection of the terminal part 15a, the protection circuit unit 16a, and the common line 17a. Further, FIG. 4B illustrates an exemplary connection of the terminal part 15b, the protection circuit unit 16b, and the common line 17b.

As illustrated in FIG. 4A, the protection circuit unit 16a includes non-linear elements 161a, such as diodes or the like, as protection circuits, the number of which is equal to the number of the data terminals 151. Regarding each non-linear element 161a, the anode thereof is connected with the common line 17a, and the cathode thereof is connected with the data terminal 151.

The common line 17a is connected with a GND terminal 171a. To the GND terminal 171a, a potential V2 equal to or lower than a potential V1 (for example, 1 V) of the data line 10 is supplied from outside the active matrix substrate 1. In other words, in this example, the non-linear element 161a is connected in a reverse bias state between the data line 10 and the common line 17a.

The bias line 13 is connected with the bias terminal 152. To the bias terminal 152, a predetermined bias voltage V3 is applied from outside. The bias voltage V3 is a voltage to reverse-bias the photoelectric conversion element 22. In this example, as the bias voltage (V3), a voltage lower than the potential V1 of the data line 10 (for example, −6 V) is applied.

As illustrated in FIG. 4B, the protection circuit unit 16b includes, for example, protection circuits 161b each of which connects two non-linear elements (1611, 1612), the number of the protection circuits 161b being equal to the number of the gate terminals 153. Each protection circuit 161b is connected with the gate terminal 153. More specifically, regarding the non-linear element 1611, the anode thereof is connected with the gate terminal 153, and the cathode thereof is connected with the common line 17b.

Regarding the non-linear element 1612, the anode thereof is connected with the common line 17b, and the cathode thereof is connected with the gate terminal 153.

The common line 17b is connected with the GND terminal 171b. To the GND terminal 171b, the potential V2 equal to that of the GND terminal 171a is supplied from outside the active matrix substrate 1. The configuration, however, may be any configuration as long as a predetermined voltage is applied to the gate line 11 even if leakage current flows in via the protection circuit 161b. The common line 17b therefore does not have to be connected with the GND terminal 171b via the terminal 171b. In other words, the common line 17b may be in a floating state of being connected with no element.

In this example, when the gate lines 11 are scanned, a scanning voltage Vgh (for example, +20 V) is supplied to the gate lines 11, and during a non-scanning period, a voltage Vgl (for example, −10 V) lower than the voltage of the common line 17b is supplied to the gate lines 11.

During the non-scanning period, the non-linear element 1611 is reverse-biased between the gate terminal 153 and the common line 17b, and the non-linear element 1612 is forward-biased between the gate terminal 153 and the common line 17b. Further, when the scanning voltage Vgh is applied to the gate line 11, the non-linear element 1611 becomes forward-biased, and the non-linear element 1612 becomes reverse-biased.

Figure 5:
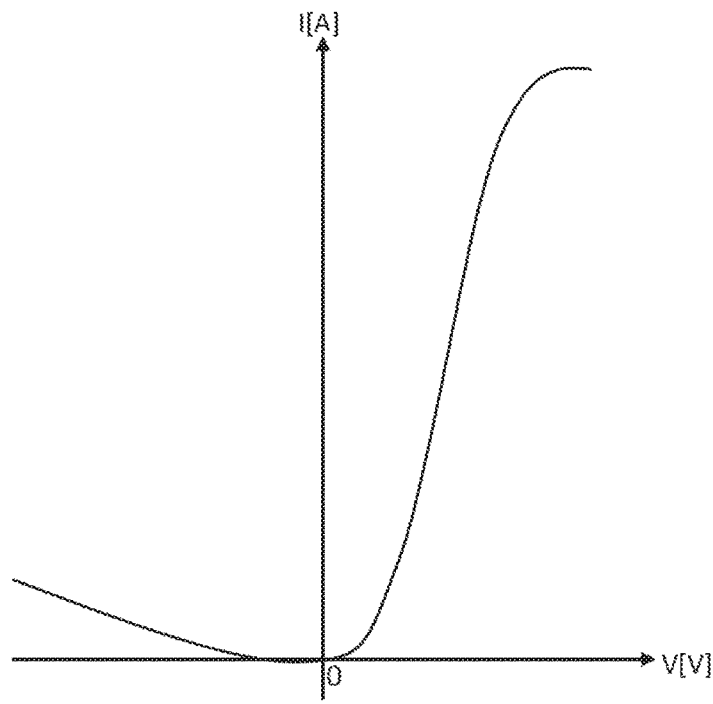
FIG. 5 illustrates current (I)-voltage (V) properties of a thin film diode.

Here, electric current (I)-voltage (V) properties of the thin film diode are illustrated in FIG. 5. As illustrated in FIG. 5, as a negative voltage increases, off-leakage current increases. In a case where a thin film diode is used as the non-linear element 161a, it is necessary to reduce leakage current at the non-linear element 161a to the lowest possible level, in order to make the data line 10 free from influences of leakage current.

In the present embodiment, the potential V2 of the common line 17a is set so as to be close to the potential of the data line 10. With this, the off-leakage current of the non-linear element 161a is reduced, and thereby, when an image is picked up, the data line 10 is not affected by the leakage current of the non-linear element 161a, which makes it possible to pick up the image appropriately. Further, even if leakage current occurs via a non-linear element 161a connected with a certain data terminal 151, each non-linear element 161a is connected in a reverse bias state, and hence, leakage current hardly flows into the data line 10 via another non-linear element 161a.

Further, in the present embodiment, the branch bias line 131 is arranged in each pixel, in close contact with the data line 10, and the branch bias line 131 and the data line 10 are coupled with each other via a capacitor.

As described above, in the active matrix substrate 1, a capacitor is formed between the anode electrode of the photoelectric conversion element 22 and the data line 10 with an interlayer insulating film (not shown) being interposed between, and as the interlayer insulating film has a greater film thickness, the capacitor has a smaller capacitance. Accordingly, by increasing the film thickness of the interlayer insulating film, the magnitude of the electric field between the anode electrode of the photoelectric conversion element 22 and the data line 10 decreases. Thereby, static electricity becomes less likely to occur between the data lines 10 and the anode electrodes of the photoelectric conversion elements 22 as well as the branch bias lines 131 and the bias line 13 connected to the anode electrodes.

Further, since the branch bias line 131 is provided in a slit form in each pixel, even if static electricity enters the bias lines 13 and the branch bias lines 131, static electricity is equally dispersed over the entire pixels. Consequently, the intensity of the electric field applied due to static electricity between the anode electrode of the photoelectric conversion element 22 and the data line 10 in each pixel is reduced as well, whereby TFT 21, the photoelectric conversion element 22, the bias line 13, the branch bias line 131, and the data line 10 in the pixel can be protected from static electricity.

Further, between the gate terminal 153 and the common line 17b, the non-linear element 1611 in the reverse bias state and the non-linear element 1612 in the forward bias state are connected. During the non-scanning period, in a case where greater static electricity than the potential of the common line 17b enters from the gate line 11, the non-linear element 1611 of the protection circuit unit 16b connected to the gate line 11 is forward-biased, and the non-linear element 1612 is reverse-biased. Here, since the non-linear elements 1612 of the other protection circuit units 16b are forward-biased, static electricity is dispersed among the common line 17b and other gate lines 11.

The data terminals 151, the gate terminals 153, and the bias terminals 152 illustrated in FIG. 3 mentioned above may be used as inspection terminals in the process of manufacture of the imaging panel. In this case, in the areas where the data terminals 151 and the gate terminals 153 are provided, bias terminals, data terminals, and gate terminals (all are not shown) for mounting, which are used after the process of imaging panel manufacture, may be provided. Incidentally, in some cases, the inspection terminals and the common lines 17a, 17b are separated from the image pickup area Ra after the imaging panel manufacture, thereby becoming in a floating state.

[Embodiment 2]

Figure 6:
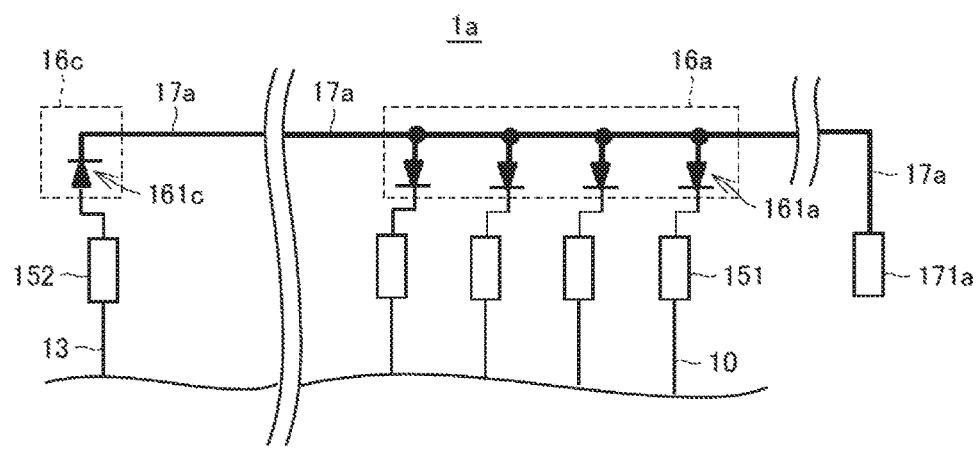
FIG. 6 illustrates an exemplary connection of a bias line, a data line, and a common line in Embodiment 2.

FIG. 6 illustrates an exemplary connection of the bias line 13, the data lines 10, and the common line 17a in the present embodiment. In FIG. 6, the same constituent members as those of Embodiment 1 are denoted by the same reference symbols as those in Embodiment 1. The following description mainly describes constituent members different from those in Embodiment 1.

As illustrated in FIG. 6, an active matrix substrate 1a in the present embodiment includes protection circuit units 16c each of which is connected between the bias terminal 152 and the common line 17a.

The protection circuit unit 16c includes non-linear elements 161c, such as diodes or the like, as protection circuits. Regarding each non-linear element 161c, the anode thereof is connected with the bias terminal 152, and the cathode thereof is connected with the common line 17a.

In the present embodiment, the potential V2 of the common line 17a is equal to or less than the potential V1 of the data line 10, and is higher than the potential V3 of the bias terminal 152. In other words, the potentials of the common line 17a, the data line 10, and the bias line 13 satisfy the relationship of V3<V2≤V1. Accordingly, the non-linear element 161c is connected in a reverse bias state between the common line 17a and the bias terminal 152.

The bias terminal 152 and the data terminal 151 are connected with each other via the protection circuit units 16a and 16c as well as the common line 17a. In other words, the bias line 13 and the data line 10 are connected with each other, having the potential V2, which is intermediate between the potential V1 of the data line 10 and the potential V3 of the bias line 13. Accordingly, as compared with Embodiment 1, the difference between the potential of the bias line 13 and the potential of the data line 10 is small, whereby static electricity is less likely to occur. As a result, TFT 21 in the pixel is less likely to be destroyed by static electricity.

Further, In a case where no GND terminal 171a is provided, and the data line 10 and the bias line 13 are simply connected with each other via the protection circuit unit 16a and the protection circuit unit 16c, the difference between the anode-side potential and the cathode-side potential of the protection circuit unit 16a is |V1−V3|, but in the present embodiment, the potential difference is |V1−V2| (<|V1−V3|). As compared with a case where the GND terminal 171a is not provided, therefore, the difference between the potential of the anode and the potential of the cathode of the protection circuit unit 16a is smaller, whereby leakage current of the protection circuit unit 16a can be reduced.

[Embodiment 3]

Figure 7:
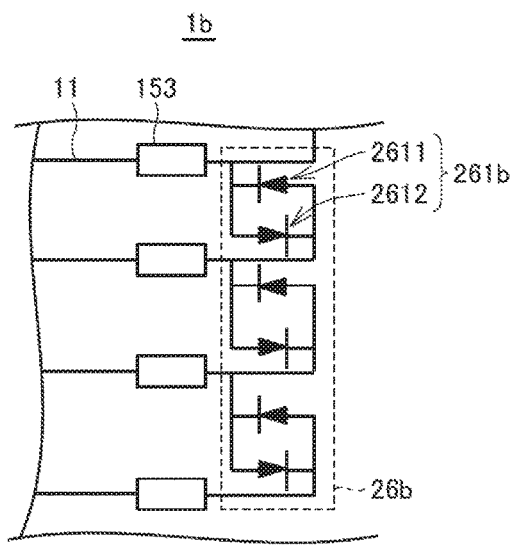
FIG. 7 illustrates an exemplary connection of a gate terminal and a protection circuit in Embodiment 3.

FIG. 7 illustrates an exemplary configuration of a protection circuit connected with the gate terminal 153 in the present embodiment. In FIG. 7, the same constituent members as those of Embodiment 1 are denoted by the same reference symbols as those in Embodiment 1. The following description mainly describes constituent members different from those in Embodiment 1.

As illustrated in FIG. 7, a protection circuit 261b is connected to each gate terminal 153 provided on an active matrix substrate 1b.

The protection circuit 261b includes two non-linear elements 2611, 2612 formed with diodes or the like. The cathode of the non-linear element 2611 and the anode of the non-linear element 2612 are connected with one and the same gate terminal 153. Further, the anode of the non-linear element 2611 and the cathode of the non-linear element 2612 in the protection circuit 261b are connected with another gate terminal 153, adjacent to the foregoing one gate terminal 153. In other words, the respective protection circuits 261b connected with the gate terminals 153 are connected in cascade, and the common line 17b (see FIG. 4B) of Embodiment 1 is not provided.

When no scanning voltage is applied to the gate lines 11, the non-linear elements 2611, 2612 are reverse-biased.

In Embodiment 1, since the GND terminal 171a and the GND terminal 171b have the same potential, the GND terminal 171a and the GND terminal 171b are connected in some cases. If static electricity having a potential greater than that of the GND terminal 171b enters in this state from the gate line 11, static electricity flows from the common line 17b to the GND terminal 171b, and electric current flows from the GND terminal 171b to the GND terminal 171a. Here, when the potential of the GND terminal 171a rises to or above the potential of the data line 10, the non-linear element 161a is possibly forward-biased, and electric current flows through the data line 10.

On the other hand, in the present embodiment, the configuration is such that the gate line 11 and the GND terminal 171a are not connected. During the non-scanning period, therefore, even if static electricity having a potential greater than potential Vgl enters from the gate line 11, the non-linear element 2612 connected with the gate line 11 is forward-biased, which causes electric current caused by the static electricity to flow through another gate line 11 adjacent the foregoing gate line 11. In the present embodiment, therefore, even if static electricity enters from the gate line 11, the image pickup can be performed surely, without the data line 10 being influenced by static electricity.

[Embodiment 4]

Figure 8:
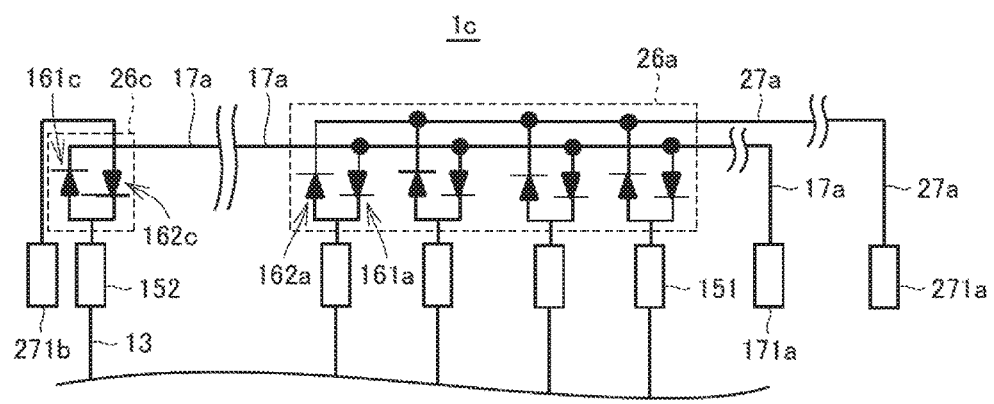
FIG. 8 illustrates a configuration of a protection circuit that is connected to a data terminal and a bias terminal in Embodiment 4.

FIG. 8 illustrates a configuration of a protection circuit connected to the data terminals 151 and the bias terminal 152 in the present embodiment. In FIG. 8, the same constituent members as those of Embodiment 1 are denoted by the same reference symbols as those in Embodiment 1. The following description mainly describes constituent members different from those in Embodiment 1.

As illustrated in FIG. 8, the active matrix substrate 1c in the present embodiment includes a protection circuit unit 26a connected with the data terminals 151. The protection circuit unit 26a includes non-linear elements 162a, as protection circuits, in addition to the non-linear elements 161a identical to those of Embodiment 1.

Further, the active matrix substrate 1c includes a common line 27a connected with the non-linear elements 162a, and a common terminal 271a connected with the common line 27a.

The anode of the non-linear element 162a is connected with the data terminal 151, and the cathode of the non-linear element 162a is connected with the common line 27a.

To the common terminal 271a, a potential of, for example, about 1 V higher than that of the data line 10, is supplied from outside. The non-linear element 162a is connected in a reverse bias state between the data terminal 151 and the common line 27a.

Further, the active matrix substrate 1c includes protection circuit units 26c connected with the bias terminals 152, and terminals 271b connected with the protection circuit units 26c.

Each protection circuit unit 26c includes a non-linear element 162c, as a protection circuit, in addition to the non-linear element 161c identical to those of Embodiment 1.

The anode of the non-linear element 162c is connected with a terminal 271b, and the cathode of the non-linear element 162c is connected with the bias terminal 152.

To the terminal 271b, a potential of, for example, about 1 V lower than that of the bias terminal 152, is supplied from outside. The non-linear element 162c is connected in a reverse bias state between the bias terminal 152 and the terminal 271b.

With such a configuration, even if static electricity having a potential lower than that of the terminal 271b enters from the bias line 13, the non-linear element 162c becomes forward-biased, but the non-linear element 161c remains reverse-biased. This allows electric current to flow from the terminal 271b to the bias terminal 152, thereby making it possible to protect TFT 21 in the pixel from static electricity.

Further, even if static electricity having a potential higher than that of the common terminal 271a enters the data line 10, the non-linear elements 162a connected with the data lines 10 via the data terminals 151 are forward-biased, but the non-linear elements 161a remain reverse-biased. This makes it possible to cause static electricity to flow from the data terminals 151 via the non-linear elements 162a to the common terminal 271a, thereby protecting TFT 21 in the pixel from static electricity.

Embodiments of the present invention are described in detail above, but these are merely examples for implementing the present invention. The present invention is not limited by the embodiments described above at all. The present invention, therefore, is not limited to the above-described embodiment, and the above-described embodiment can be appropriately varied and implemented without departing from the spirit and scope of the invention. The following description describes modification examples of the present invention.

(1) In Embodiments 1, 2, and 4, the configuration of the protection circuit 261b of Embodiment 3 may be applied. More specifically, in Embodiments 1, 2, and 4, the configuration maybe such that the protection circuit 261b is connected in cascade to the gate terminal 153, and the common line 17b and the GND terminal 171b are not provided.

(2) Embodiments 1 to 4 are described with reference to the active matrix substrate before the scintillator are provided, but the configuration of any one of the above-described embodiments may be applied to an X-ray imaging panel including the scintillator provided on one surface side of the active matrix substrate. The scintillator are arranged on one surface side of the active matrix substrate to which X-ray is projected.

Further, a driving circuit for scanning the gate lines 11, and a readout circuit for reading charges corresponding to fluorescence, as a result of conversion by the scintillator, from the photoelectric conversion elements 22 through the data lines 10, may be connected to this X-ray imaging panel.

(3) The process of manufacture may be such that, after the active matrix substrate of any one of Embodiments 1 to 4 described above is produced as an X-ray imaging panel, the protection circuit units and the image pickup area Ra on the active matrix substrate may be separated. The protection circuit unit may be used for reducing influences of leakage current or static electricity, at least in image pickup inspection in the process of manufacture of the active matrix substrate before the scintillator are provided.

DESCRIPTION OF REFERENCE NUMERALS 1, 1a to 1c: active matrix substrate
10: data line
11: gate line
13: bias line
15a, 15b: terminal part
16a, 16b, 16c, 26a, 26c: protection circuit unit
17a, 17b, 27a: common line
21: TFT
22: photoelectric conversion element
151: data terminal
152: bias terminal
153: gate terminal
161a, 161b, 161c. 162a, 1611, 1612, 2611, 2612: non-linear element
171a, 171b: GND terminal
271a: common terminal
271b: terminal

The invention claimed is:
1. An active matrix substrate comprising:
an image pickup area that has a plurality of pixels that are defined by a plurality of gate lines and a plurality of data lines intersecting with the gate lines;
photoelectric conversion elements that are provided with respect to the pixels, respectively;
a bias line that supplies a bias voltage to the photoelectric conversion elements provided with respect to the pixels;
a plurality of data protection circuits that are connected with the data lines, respectively, outside the image pickup area; and
a first common line that is connected with the data protection circuits outside the image pickup area and has a potential that is higher than that of the bias voltage and equal to or lower than those of the data lines,
wherein each of the data protection circuits includes only one first data non-linear element, the first data non-linear element being connected in a reverse bias state between the first common line and each of the data lines.

2. The active matrix substrate according to claim 1, further comprising a bias protection circuit connected with the bias line and the first common line,
- wherein the bias line is composed of a first bias line provided outside the image pickup area, and second bias lines that are provided in the pixels and are connected with the first bias line,
- the bias protection circuit includes only one bias non-linear element,
- the bias non-linear element being connected in a reverse bias state between the first bias line and the first common line.

3. The active matrix substrate according to claim 1, further comprising:
- a second common line that is provided outside the image pickup area and has a potential higher than those of the data lines; and
- a bias terminal that is provided outside the image pickup area and has a potential lower than that of the bias line,
- wherein the bias line is composed of a first bias line provided outside the image pickup area, and second bias lines that are provided in the pixels and are connected with the first bias line,
- each of the data protection circuits includes only one second data non-linear element in addition to the first data non-linear element, the second data non-linear element being connected in a reverse bias state between each of the data lines and the second common line, and
- the bias protection circuit includes only one first bias non-linear element, the first bias non-linear element being connected in a reverse bias state between the first bias line and the first common line, and only one second bias non-linear element, the second bias non-linear element being connected in a reverse bias state between the bias terminal and the first bias line.

4. The active matrix substrate according to claim 1, further comprising:
- a plurality of gate protection circuits that are provided outside the image pickup area and are connected with the gate lines, respectively,
- wherein each of the gate protection circuits includes two gate non-linear elements,
- the gate protection circuits are connected in cascade, and
- each of the two gate non-linear elements is connected in a reverse bias state with the gate line.

5. The active matrix substrate according to claim 1, further comprising:
- a plurality of gate protection circuits that are provided outside the image pickup area and are connected with the gate lines, respectively; and
- a fourth common line that is provided outside the image pickup area and has the same potential as that of the first common line,
- wherein each of the gate protection circuits includes two gate non-linear elements, and
- one of the two gate non-linear elements is connected in a reverse bias state between one of the gate lines and the fourth common line, and the other gate non-linear element is connected in a forward bias state between the one of the gate lines and the fourth common line.

6. The active matrix substrate according to claim 1, further comprising:
- a plurality of gate protection circuits that are provided outside the image pickup area and are connected with the gate lines, respectively; and
- a fourth common line that is provided in a floating state outside the image pickup area,
- wherein each of the gate protection circuits includes two gate non-linear elements, and
- one of the two gate non-linear elements is connected in a reverse bias state between one of the gate lines and the fourth common line, and the other gate non-linear element is connected in a forward bias state between the one of the gate lines and the fourth common line.

7. An X-ray imaging panel comprising:
- the active matrix substrate according to claim 1; and
- a scintillator that is provided on one of surface sides of the active matrix substrate and converts irradiated X-ray into fluorescence.

8. The X-ray imaging panel according to claim 7, further comprising:
- a driving circuit that is connected with the active matrix substrate and scans the gate lines; and
- a readout circuit that is connected with the active matrix substrate and reads out charges corresponding to fluorescence as a result of conversion by the scintillator through the data lines.

* * * * *